(12) United States Patent
Zhu et al.

(10) Patent No.: US 12,456,966 B2
(45) Date of Patent: Oct. 28, 2025

(54) CIRCUIT BOARD STRUCTURE, INFORMATION PROCESSING METHOD AND APPARATUS, AND COMMUNICATION DEVICE

(71) Applicant: VIVO MOBILE COMMUNICATION CO., LTD., Guangdong (CN)

(72) Inventors: Lei Zhu, Guangdong (CN); Shuang Wu, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 91 days.

(21) Appl. No.: 18/633,292

(22) Filed: Apr. 11, 2024

(65) Prior Publication Data
US 2024/0259000 A1     Aug. 1, 2024

Related U.S. Application Data

(63) Continuation of application No. PCT/CN2022/124039, filed on Oct. 9, 2022.

(30) Foreign Application Priority Data

Oct. 12, 2021  (CN) .......................... 202111185979.0

(51) Int. Cl.
*H05K 1/18*       (2006.01)
*G01K 1/02*       (2021.01)
(Continued)

(52) U.S. Cl.
CPC ............ *H03K 3/011* (2013.01); *G01K 1/026* (2013.01); *H05K 1/14* (2013.01); *H05K 1/18* (2013.01);
(Continued)

(58) Field of Classification Search
CPC .......... H03K 3/011; G01K 1/026; H05K 1/14; H05K 1/18; H05K 2201/09036;
(Continued)

(56) References Cited

U.S. PATENT DOCUMENTS

| | | | | |
|---|---|---|---|---|
| 8,756,549 B2 * | 6/2014 | Graf | ................... | G05D 23/1934 716/132 |
| 2012/0168416 A1 * | 7/2012 | Graf | ................... | G05D 23/1934 219/209 |

(Continued)

FOREIGN PATENT DOCUMENTS

| | | |
|---|---|---|
| CN | 207053886 U | 2/2018 |
| CN | 108346409 A | 7/2018 |

(Continued)

OTHER PUBLICATIONS

International Search Report and Written Opinion for Application No. PCT /CN2022/124039, dated Dec. 23, 2022, 8 Pages.

*Primary Examiner* — Ryan Jager
(74) *Attorney, Agent, or Firm* — BROOKS KUSHMAN P.C.

(57) ABSTRACT

A circuit board structure, an information processing method and apparatus, and a communication device. The circuit board structure includes a circuit board substrate, a temperature drift processing chip, and at least two heat-sensitive elements; the circuit board substrate including a first substrate and a second substrate opposite the first substrate. The first substrate is provided with a heat-generating device; and the second substrate has a cavity, the cavity being provided with at least one boss extending toward the first substrate. The heat-generating device is located between the first substrate and the boss; the at least two heat-sensitive elements are disposed at a peripheral position of the heat-generating device; and the temperature drift processing chip is electrically connected to the at least two heat-sensitive (Continued)

elements, and the temperature drift processing chip is disposed on the circuit board substrate.

20 Claims, 5 Drawing Sheets

(51) Int. Cl.
*H03K 3/011* (2006.01)
*H05K 1/14* (2006.01)

(52) U.S. Cl.
CPC .............. *H05K 2201/09036* (2013.01); *H05K 2201/10151* (2013.01)

(58) Field of Classification Search
CPC ........... H05K 2201/10151; H05K 1/02; H05K 1/0201; H05K 1/181; H05K 7/20209
USPC .......................................................... 327/513
See application file for complete search history.

(56) References Cited

U.S. PATENT DOCUMENTS

2021/0080775 A1* 3/2021 Li ..................... G02F 1/133382
2024/0259000 A1* 8/2024 Zhu ........................ H03K 3/011

FOREIGN PATENT DOCUMENTS

| CN | 109711027 A | 5/2019 |
| CN | 113939076 A | 1/2022 |

* cited by examiner

CIRCUIT BOARD STRUCTURE, INFORMATION PROCESSING METHOD AND APPARATUS, AND COMMUNICATION DEVICE

CROSS-REFERENCE TO RELATED APPLICATIONS

This application is a continuation of International Application No. PCT/CN2022/124039 filed on Oct. 9, 2022, which claims priority to Chinese Patent Application No. 202111185979.0 filed on Oct. 12, 2021, which are incorporated herein by reference in their entireties.

TECHNICAL FIELD

This application pertains to the field of communication technologies, and specifically, relates to a circuit board structure, an information processing method and apparatus, and a communication device.

BACKGROUND

Resin is the main material of printed circuit boards (PCB), integrated circuit (IC, which may also be referred to as a chip) carriers, and chip molding. The dielectric constant (Dk) and loss factor (Df) of the resin can cause losses in signal transmission, affecting signal integrity. Dk and Df of the resin exhibit a phenomenon called temperature drift, meaning that Dk and Df increase with temperature. In addition, larger Dk and Df result in greater losses in signal transmission. Therefore, as the temperature increases, the signal transmission losses in the PCB and IC carrier increase, leading to poorer signal integrity.

With higher frequencies used for signal transmission of terminals (mobile phones, smart wearable devices, tablets, and the like) in 5th generation (5G) communication systems, the impact of temperature drift in Dk and Df of resin on the signal integrity is further aggravated. This ultimately leads to problems such as delayed response, screen freezing, and no responding in terminals such as mobile phones, significantly affecting the user experience.

Currently, there is no specific solution to temperature drift in PCBs and IC carriers in terminal products. In the conventional design solution, simulation margins are increased during signal debugging of terminal products to meet the basic digital signal transmission requirements even when signal integrity deteriorates, that is, "ensuring functionality while reducing performance."

In view of the above, the prior art has the following specific defects:

1. In the existing solution, the applicable temperature range of devices is increased through debugging during product design, which means that devices provide the optimal performance experience at room temperature. As the temperature increases or decreases, the performance deteriorates, but the basic functionality is maintained. As the temperature further changes to extreme conditions, the signal integrity continues to deteriorate, and the basic functionality is lost. This defect severely affects the user experience and limits the product application range.

2. With the application of 5G millimeter waves, the increasingly high signal transmission frequencies exacerbate the impact of temperature drift in PCBs and IC carriers on the signal integrity, making the product signal debugging increasingly challenging. This ultimately leads to longer product development cycles or the inability to bring products to market.

It can be learned from the above that in the prior art, signal performance is affected by temperature drift in circuit board structures.

SUMMARY

Embodiments of this application are intended to provide a circuit board structure, an information processing method and apparatus, and a communication device.

According to a first aspect, an embodiment of this application provides a circuit board structure, including:
a circuit board substrate, a temperature drift processing chip, and at least two heat-sensitive elements; the circuit board substrate including a first substrate and a second substrate opposite the first substrate; where
the first substrate is provided with a heat-generating device; and the second substrate has a cavity, the cavity being provided with at least one boss extending toward the first substrate; and
the heat-generating device is located between the first substrate and the boss; the at least two heat-sensitive elements are disposed at a peripheral position of the heat-generating device; and the temperature drift processing chip is electrically connected to the at least two heat-sensitive elements, and the temperature drift processing chip is disposed on the circuit board substrate.

According to a second aspect, an embodiment of this application provides a communication device, including the foregoing circuit board structure.

According to a third aspect, an embodiment of this application provides an information processing method, applied to the foregoing communication device. The method includes:
obtaining first temperature information collected by each heat-sensitive element disposed at a peripheral position of a heat-generating device;
obtaining calibration parameter information based on the first temperature information; and
sending the calibration parameter information to a signal processing chip corresponding to the heat-generating device; where
the calibration parameter information is used for signal calibration by the signal processing chip.

According to a fourth aspect, an embodiment of this application provides an information processing apparatus, applied to the foregoing communication device. The apparatus includes:
a first obtaining module configured to obtain first temperature information collected by each heat-sensitive element disposed at a peripheral position of a heat-generating device;
a second obtaining module configured to obtain calibration parameter information based on the first temperature information; and
a first sending module configured to send the calibration parameter information to a signal processing chip corresponding to the heat-generating device; where
the calibration parameter information is used for signal calibration by the signal processing chip.

According to a fifth aspect, an embodiment of this application provides a communication device, where the communication device includes a processor, a memory, and a program or instructions stored in the memory and capable of running on the processor, and when the program or instructions are executed by the processor, the steps of the method according to the third aspect are implemented.

According to a sixth aspect, an embodiment of this application provides a readable storage medium, where the readable storage medium stores a program or instructions, and when the program or instructions are executed by a processor, the steps of the method according to the third aspect are implemented.

According to a seventh aspect, an embodiment of this application provides a chip. The chip includes a processor and a communication interface, where the communication interface is coupled to the processor, and the processor is configured to run a program or instructions to implement the method according to the third aspect.

According to an eighth aspect, a computer program/program product is provided, where the computer program/program product is stored in a non-transient storage medium, and the program/program product is executed by at least one processor to implement the steps of the method according to the third aspect.

According to a ninth aspect, a communication device is provided, configured to perform the steps of the method according to the third aspect.

DETAILED DESCRIPTION

Figure 1:
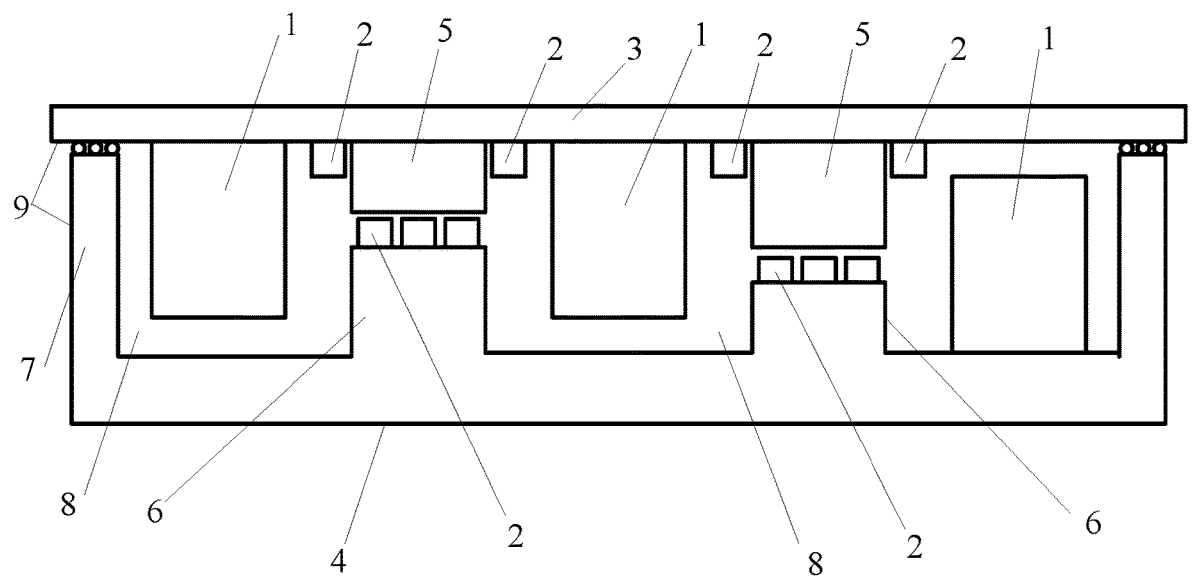
FIG. 1 is a schematic diagram of a circuit board structure according to an embodiment of this application.
Figure 2:
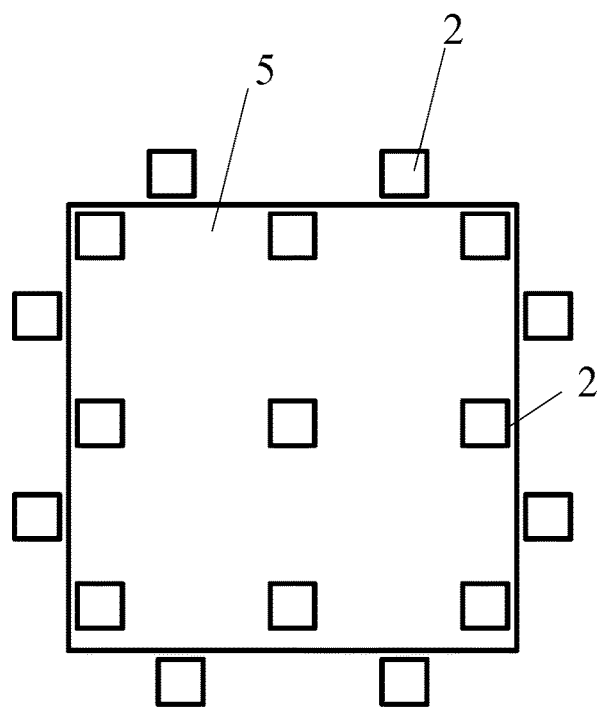
FIG. 2 is a first schematic diagram of deployment of heat-sensitive elements according to an embodiment of this application.
Figure 3:
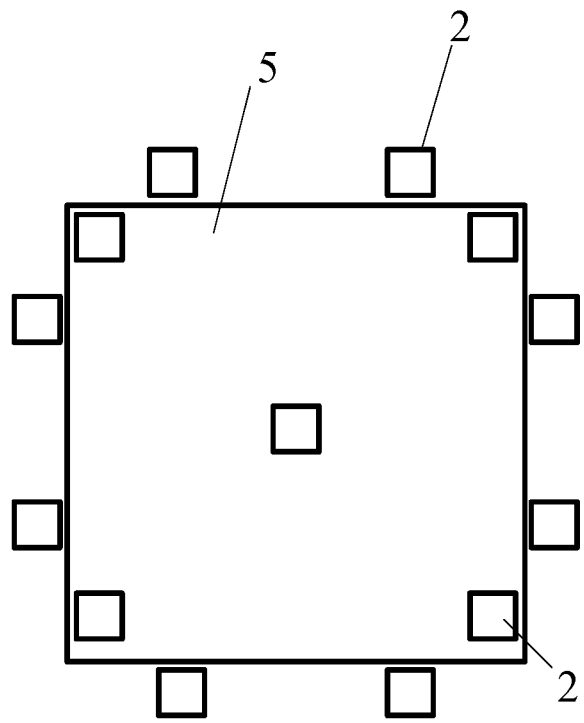
FIG. 3 is a second schematic diagram of deployment of heat-sensitive elements according to an embodiment of this application.

The following clearly describes the technical solutions in the embodiments of this application with reference to the accompanying drawings in the embodiments of this application. Apparently, the described embodiments are only some but not all of the embodiments of this application. All other embodiments obtained by persons of ordinary skill in the art based on the embodiments of this application shall fall within the protection scope of this application.

The terms "first", "second", and the like in this specification and claims of this application are used to distinguish between similar objects rather than to describe a specific order or sequence. It should be understood that data used in this way are interchangeable in appropriate circumstances such that the embodiments of this application can be implemented in an order other than those illustrated or described herein. In addition, "first", "second", and the like are typically used to distinguish objects of a same type and do not limit quantities of the objects. For example, there may be one or more first objects. In addition, in the specification and claims, "and/or" indicates at least one of the connected objects, and the character "/" generally indicates an "or" relationship between the contextually associated objects.

The following describes in detail the circuit board structure provided in the embodiments of this application through specific embodiments and application scenarios thereof with reference to the accompanying drawings.

As shown in FIG. 1 to FIG. 4, the circuit board structure provided in the embodiments of this application includes:

a circuit board substrate 9, a temperature drift processing chip 1, and at least two heat-sensitive elements 2; the circuit board substrate 9 including a first substrate 3 and a second substrate 4 opposite the first substrate 3; where the first substrate 3 is provided with a heat-generating device 5; and the second substrate 4 has a cavity, the cavity being provided with at least one boss 6 extending toward the first substrate 3; and the heat-generating device 5 is located between the first substrate 3 and the boss 6; the at least two heat-sensitive elements 2 are disposed at a peripheral position of the heat-generating device 5; and the temperature drift processing chip 1 is electrically connected to the at least two heat-sensitive elements 2, and the temperature drift processing chip 1 is disposed on the circuit board substrate 9 (which may specifically be the first substrate 3 or the second substrate 4, but is not limited thereto).

The heat-sensitive element can collect peripheral temperature of the heat-generating device and transmit it to the temperature drift processing chip, and the temperature drift processing chip can obtain corresponding calibration parameter information based on the peripheral temperature and transmit it to a signal processing chip corresponding to the heat-generating device for signal calibration. Specifically, it can be understood as follows: the heat-sensitive element collects the peripheral temperature of the heat-generating device and sends it to the temperature drift processing chip, the temperature drift processing chip obtains the calibration parameter information and sends it to the signal processing chip corresponding to the heat-generating device, and the signal processing chip sends instructions to the heat-generating device accordingly. The circuit board substrate may be a PCB, the first substrate may be referred to as a PCB main board, and the second substrate may be referred to as a first PCB, which are not limited thereto.

In the embodiments of this application, the temperature drift processing chip may be provided in at least one, the heat-generating device may also be provided in at least one, and a correspondence between the heat-generating device and the temperature drift processing chip may be one-to-one, one-to-many, or many-to-one (all the heat-sensitive elements corresponding to the heat-generating device are electrically connected to at least one temperature drift processing chip, for example, all of them are connected to a temperature drift processing chip A, or some of them are connected to the temperature drift processing chip A and the remaining are connected to a temperature drift processing chip B), which is not limited herein. The heat-sensitive element may be a heat-sensitive capacitor, a heat-sensitive resistor, a heat-sensitive material, or the like, which is not limited herein. The first substrate may be mounted together with the second substrate, which is not limited thereto. The heat-generating device includes a chip and the like, which is not limited thereto. Height and shape of the boss may be determined according to the heat-generating device, which is not limited thereto.

In the embodiments of this application, the circuit board structure is provided with a circuit board substrate, a temperature drift processing chip, and at least two heat-sensitive elements; the circuit board substrate including a first substrate and a second substrate opposite the first substrate. The first substrate is provided with a heat-generating device; and the second substrate has a cavity, the cavity being provided with at least one boss extending toward the first substrate. The heat-generating device is located between the first substrate and the boss; the at least two heat-sensitive elements are disposed at a peripheral position of the heat-generating device; and the temperature drift processing chip is electrically connected to the at least two heat-sensitive elements, and the temperature drift processing chip is disposed on the circuit board substrate. With the customized design of position, shape, and height of the boss based on application requirements, 3D stacking, device layout, and mounting combination of the substrate (for example, a PCB) can be changed, achieving arbitrary-distance contact and monitoring between devices longitudinally arranged in the cavity, and avoiding the problems such as long distance, insensitivity, and delayed response between the heat-sensitive element and a monitoring target, thereby achieving real-time monitoring of the target device. In addition, with functional characteristics of the heat-sensitive element varying with temperature, the characteristic changes of the heat-sensitive element are monitored in real time to achieve real-time monitoring of temperature of the target device and substrate (for example, a PCB) network. Ultimately, a waveform during target signal transmission is dynamically adjusted through the temperature drift processing chip, which ensures signal integrity of the target network and solves a series of problems caused by temperature drift, thereby effectively solving the problem in the prior art that signal performance is affected by temperature drift in circuit board structures.

As shown in FIG. 1, a recess 8 is formed between the boss 6 and a side wall 7 of the cavity or between two of the bosses 6; where the temperature drift processing chip 1 is disposed in the recess 8 or on the boss (not shown in the figure).

This allows for better provision of the temperature drift processing chip.

As shown in FIG. 1 to FIG. 4, the peripheral position includes a position surrounding the heat-generating device 5 on the first substrate 3 and a position opposite the heat-generating device 5 on a boss 6 opposite the heat-generating device 5. It can also be understood as the peripheral position including a peripheral position of the heat-generating device 5 on the first substrate 3 and a position close to the heat-generating device 5 on the boss 6.

Figure 4:
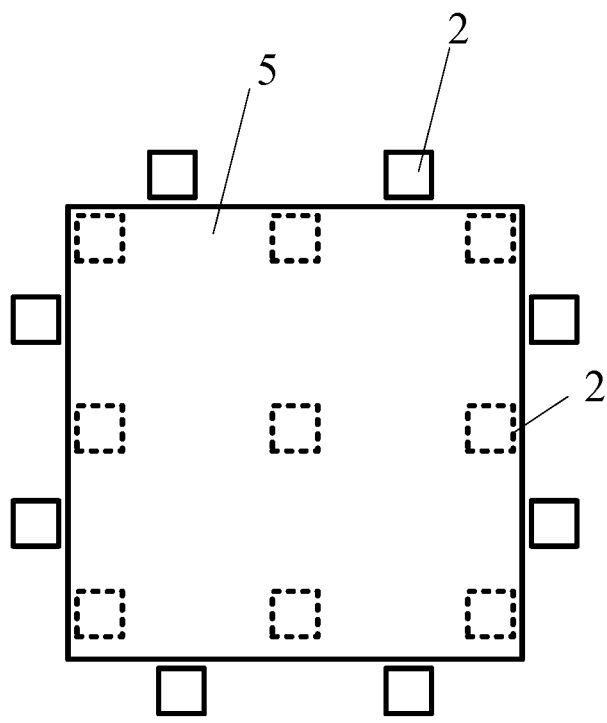
FIG. 4 is a third schematic diagram of deployment of heat-sensitive elements according to an embodiment of this application.

This allows for more accurate measurement of peripheral temperature of the heat-generating device. Specifically, the at least two heat-sensitive elements may be uniformly distributed at the peripheral position of the heat-generating device, including uniformly distributed on the boss, and/or uniformly distributed on the first substrate. The heat-sensitive element 2 represented by a dashed-line box in FIG. 4 is the heat-sensitive element 2 disposed on the boss 6.

In the embodiments of this application, the second substrate 4 is connected to the first substrate 3 through a side wall 7 of the cavity (as shown in FIG. 1), and/or the second substrate is connected to the first substrate (not shown in the figure) through at least one of the bosses.

This allows for better connection between the second substrate and the first substrate. The second substrate may be connected to the first substrate using solder balls.

An embodiment of this application further provides a communication device, including the foregoing circuit board structure. Further, the communication device may further include a signal processing chip electrically connected to a temperature drift processing chip on the circuit board structure. The signal processing chip can perform signal calibration based on calibration parameter information sent by the temperature drift processing chip; determine instructions based on the calibrated signal; and send the instructions to the heat-generating device.

In the embodiments of this application, the communication device may be an electronic product (electronic device) such as a mobile phone, a tablet, a computer, or a smart wearable device, or a device such as a base station, a server, or vehicle user equipment, which is not limited herein.

The communication device provided in this embodiment of this application can implement the functions implemented in the structure embodiments in FIG. 1 to FIG. 4. To avoid repetition, details are not described herein again.

Figure 5:
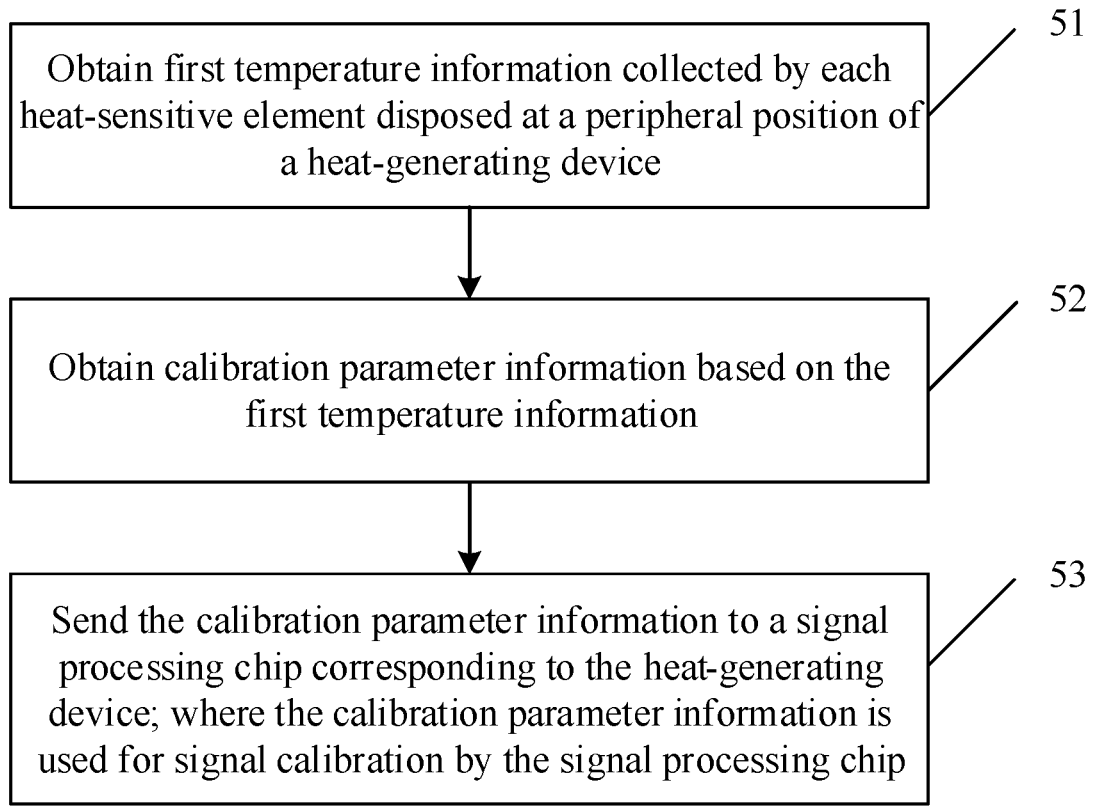
FIG. 5 is a schematic flowchart of an information processing method according to an embodiment of this application.

An embodiment of this application further provides an information processing method, applied to the foregoing communication device. As shown in FIG. 5, the method includes the following steps.

Step 51: Obtain first temperature information collected by each heat-sensitive element disposed at a peripheral position of a heat-generating device.

The first temperature information may include peripheral temperature of the heat-generating device.

Step 52: Obtain calibration parameter information based on the first temperature information.

The calibration parameter information may include waveform parameter information of a calibrated signal.

Step 53: Send the calibration parameter information to a signal processing chip corresponding to the heat-generating device; where the calibration parameter information is used for signal calibration by the signal processing chip.

The signal processing chip can obtain instructions based on the calibrated signal and send the instructions to the heat-generating device, thereby correcting the impact caused by temperature drift.

In this embodiment of this application, the obtaining calibration parameter information based on the first temperature information includes: determining, based on the first temperature information, second temperature information of a chip carrier and circuit board substrate corresponding to the heat-generating device; and obtaining corresponding calibration parameter information based on the second temperature information. The circuit board substrate may specifically be a printed circuit board PCB, but is not limited thereto.

In this way, the calibration parameter information can be better obtained. "A chip carrier and circuit board substrate corresponding to the heat-generating device" may specifically be the chip carrier and circuit board substrate connected to the heat-generating device.

In this embodiment of this application, the obtaining corresponding calibration parameter information based on the second temperature information includes: obtaining the corresponding calibration parameter information based on the second temperature information and a temperature drift correspondence; where the temperature drift correspondence includes a correspondence between temperature information and calibration parameter information.

In this way, the calibration parameter information can be obtained more accurately.

The following describes the circuit board structure and the information processing method provided in the embodiments of this application by using an example in which the communication device is a terminal product (that is, a terminal device), the circuit board substrate is a PCB, the first substrate is a printed circuit board PCB main board, and the second substrate is a cavity PCB.

In view of the foregoing technical problems, the embodiments of this application provide a circuit board structure and an information processing method, which can be specifically implemented as a technical solution in which the cavity PCB (cavity PCB: a printed circuit board with a cavity structure) technology is applied to solve the problem of temperature drift in a PCB and IC carrier. In this solution: (1) with the customized design of position, shape, and height of a PCB step (corresponding to the foregoing boss) in the cavity based on application requirements, 3D stacking, device layout, and mounting combination of a PCB of a terminal product are changed, achieving arbitrary-distance contact and monitoring between devices longitudinally arranged in the cavity; and (2) with functional characteristics of the heat-sensitive element (for example, a heat-sensitive capacitor, a heat-sensitive resistor, or a heat-sensitive material) varying with temperature, the heat-sensitive element is placed or mounted on a device (corresponding to the foregoing heat-generating device) such as an IC that needs to be monitored and on a cavity step (corresponding to the foregoing boss) corresponding to a (corresponding) PCB network, and the characteristic changes of the heat-sensitive element are monitored in real time to achieve real-time monitoring of temperature of the target device and the PCB network. In addition, with the differences and customized design of the position, shape, and height of the cavity step, the problems such as long distance, insensitivity, and delayed response between the heat-sensitive element and a monitoring target are avoided, thereby achieving real-time monitoring of the target device. Ultimately, a waveform during target signal transmission can be dynamically adjusted through the set adjustment logic and the temperature drift processing chip, which ensures signal integrity of the target network and solves a series of problems caused by temperature drift.

Specifically, this solution provides a technical solution in which the cavity technology is applied to solve the problem of temperature drift in a PCB and IC carrier. As shown in FIG. 1, the circuit board structure involved in this solution includes:

a PCB main board (corresponding to the first substrate 3);

a cavity PCB board (corresponding to the second substrate 4); where the PCB main board can be mounted together with the cavity PCB board to achieve 3D stacking;

a cavity step (corresponding to the boss 6), where position, shape, and height of the cavity step can be differentiated and custom-designed based on requirements, and components can be mounted on the cavity step based on design requirements; and after the heat-sensitive element 2 is mounted on the cavity step, the height and position of the step can be adjusted to achieve comprehensive and accurate temperature monitoring of a monitoring target (corresponding to the heat-generating device 5) by the heat-sensitive element 2;

a monitoring target (corresponding to the heat-generating device 5, which may include a heat-generating device such as a chip);

the heat-sensitive element 2 (including a heat-sensitive capacitor, a heat-sensitive resistor, a heat-sensitive material, or the like); and the temperature drift processing chip 1.

Specifically:

1. The heat-generating device 5 can be mounted on the PCB main board, and a plurality of heat-sensitive resistors (corresponding to the heat-sensitive element 2) are uniformly distributed around the monitored heat-generating device.

2. A plurality of cavity steps (corresponding to the boss 6) are provided on the cavity PCB board (corresponding to the second substrate 4). The height and position of the cavity steps are determined based on the height and position of the heat-generating device 5.

3. The plurality of heat-sensitive elements 2 are mounted on the cavity steps and the PCB main board, and temperature at the top and periphery of a plurality of heat-generating devices 5 is monitored after mounting.

4. The cavity PCB board is mounted on the PCB main board.

5. A plurality of temperature drift processing chips are mounted on the PCB main board or the cavity PCB board based on data processing requirements. In this solution, the functional characteristic changes of the heat-sensitive element can be monitored in real time to calculate corresponding temperature (corresponding to the foregoing second temperature information) of the IC (chip) carrier and the PCB board, then change parameters (corresponding to the foregoing calibration parameter information) of a high-frequency signal waveform are calculated based on a temperature drift correspondence table (corresponding to the foregoing temperature drift correspondence) of dielectric constants Dk and loss factors Df, and the information is output to the corresponding chips (corresponding to the foregoing signal processing chip, for example, a central processing unit (CPU) and a graphics processing unit (GPU)), thereby ensuring the signal integrity of the target network.

Based on the foregoing structure, the information processing method provided in the embodiments of this application may specifically involve the following content.

1. During product design, the optimal signal integrity and performance experience at room temperature can be achieved through signal debugging.

2. The functional characteristics of the plurality of heat-sensitive elements vary with the ambient temperature of the device after power-on.

3. The plurality of temperature drift processing chips can monitor the functional characteristic changes of the plurality of heat-sensitive elements in real time, calculate the waveform parameters (corresponding to the foregoing calibration parameter information) of the calibrated signal after temperature drift in the IC carrier and PCB board, and output the parameters to the corresponding chips, ensuring the signal integrity and performance experience after power-on. Specifically:

(1) The plurality of temperature drift processing chips calculate the corresponding temperature of the IC carrier and the PCB board by monitoring the functional characteristic changes of the plurality of heat-sensitive elements in real time.

(2) The plurality of temperature drift processing chips calculate the change parameters of the high-frequency signal waveform based on the temperature drift correspondence table of Dk and Df, and output the parameters to the corresponding chips.

In this way, the optimal signal integrity and performance experience after power-on at different ambient temperatures can be achieved through the real-time signal interaction between the heat-sensitive element and the temperature drift processing chip.

4. In use of the device, the heat-generating device continues to generate heat, and local temperature in the device increases.

5. The functional characteristics of the plurality of heat-sensitive elements vary with the ambient temperature around the heat-generating device in real time.

6. The plurality of temperature drift processing chips monitor the functional characteristic changes of the plurality of heat-sensitive elements in real time, calculate the waveform parameters of the calibrated signal after temperature drift in the IC carrier and PCB board, and output the parameters to the corresponding chips, ensuring the signal integrity and performance experience in use. The details are as follows.

(1) The plurality of temperature drift processing chips calculate the corresponding temperature of the IC carrier and the PCB board by monitoring the functional characteristic changes of the plurality of heat-sensitive elements in real time.

(2) The plurality of temperature drift processing chips calculate the change parameters of the high-frequency signal waveform based on the temperature drift correspondence table of Dk and Df, and output the parameters to the corresponding chips.

In this way, the optimal signal integrity and performance experience at different use temperatures can be maintained through the real-time signal interaction between the heat-sensitive resistor and the temperature drift processing chip.

The following can be learned from the above solution:

1. With the characteristic of customized longitudinal stacking of the cavity, "fully enclosed contact" monitoring (with zero gap) between the heat-sensitive element and the monitoring target can be achieved, and high-sensitivity and high-timeliness temperature change monitoring is achieved through bidirectional heat conduction and heat radiation.

2. The heat-sensitive elements fully enclose the monitoring target using the "five-point method or nine-point method" at the periphery and the top, which can improve comprehensiveness and accuracy of temperature monitoring, and facilitate fine and differentiated regulation in various directions based on actual requirements. The "nine-point method" at the periphery and the top can be seen in FIG. 2, and the "five-point method" at the periphery and the top can be seen in FIG. 3. The heat-sensitive elements at the "periphery" can be the heat-sensitive elements disposed on the PCB main board, and the heat-sensitive elements at the "top" can be the heat-sensitive elements disposed on the boss.

3. Through real-time monitoring of the internal devices such as the IC and the PCB network (corresponding to the monitoring of the peripheral temperature of the foregoing heat-generating device) and waveform adjustment, the optimal performance experience of the terminal device at various use temperatures can be maintained, enhancing perceived value of users.

4. Through real-time monitoring of internal and external ambient temperatures (including the temperature of the IC carrier and PCB corresponding to the heat-generating device) and waveform adjustment, the applicable ambient temperature range of the terminal device is expanded, increasing product competitiveness.

5. Through real-time waveform adjustment, the signal integrity of the product under high-frequency transmission can be ensured, improving applicability of the product in millimeter-wave and higher frequency bands, and shortening the development cycle.

In conclusion, this solution can achieve the following effects:

1. The problem of deterioration of signal integrity caused by temperature drift in the PCB and IC carrier is solved, and the optimal performance experience of the terminal device at various use temperatures can be maintained, enhancing the perceived value of users.

2. Through real-time monitoring of ambient temperature and signal adjustment, the applicable ambient temperature range of the terminal device is expanded, increasing the product competitiveness.

3. Through real-time parameter adjustment, the signal integrity issues under high-frequency transmission are solved, improving applicability of the product in millimeter-wave and higher frequency bands.

It should be noted herein that the circuit board structure and information processing method in this solution may be applicable to an electronic product such as a mobile phone, a tablet, a computer, and a smart wearable device, and a device such as a base station, a server, and vehicle user equipment, which is not limited herein.

In the embodiments of this application, first temperature information collected by each heat-sensitive element disposed at a peripheral position of a heat-generating device is obtained; calibration parameter information is obtained based on the first temperature information; and the calibration parameter information is sent to a signal processing chip corresponding to the heat-generating device; where the calibration parameter information is used for signal calibration by the signal processing chip. With functional characteristics of the heat-sensitive element varying with temperature, the characteristic changes of the heat-sensitive element are monitored in real time to achieve real-time monitoring of temperature of the target device and substrate (for example, a PCB) network. Then, the corresponding calibration parameter information is obtained and sent to the corresponding signal processing chip for signal calibration. Ultimately, a waveform during target signal transmission is dynamically adjusted, which ensures signal integrity of the target network and solves a series of problems caused by temperature drift, thereby effectively solving the problem in the prior art that signal performance is affected by temperature drift in circuit board structures.

It should be noted that the information processing method provided in the embodiments of this application may be performed by an information processing apparatus or a control module for performing the information processing method in the information processing apparatus. In the embodiments of this application, the information processing apparatus provided in the embodiments of this application is described by using the information processing method being performed by the information processing apparatus as an example.

Figure 6:
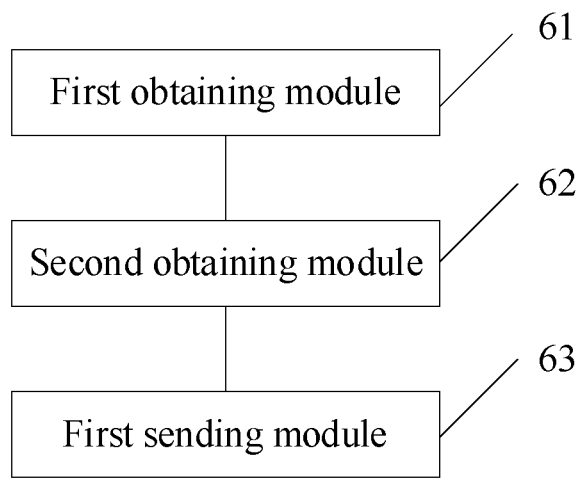
FIG. 6 is a schematic structural diagram of an information processing apparatus according to an embodiment of this application.

An embodiment of this application further provides an information processing apparatus, applied to the foregoing communication device. As shown in FIG. 6, the apparatus includes:

a first obtaining module 61 configured to obtain first temperature information collected by each heat-sensitive element disposed at a peripheral position of a heat-generating device;

a second obtaining module 62 configured to obtain calibration parameter information based on the first temperature information; and a first sending module 63 configured to send the calibration parameter information to a signal processing chip corresponding to the heat-generating device; where the calibration parameter information is used for signal calibration by the signal processing chip.

The information processing apparatus may correspond to the foregoing temperature drift processing chip.

In this embodiment of this application, the obtaining calibration parameter information based on the first temperature information includes: determining, based on the first temperature information, second temperature information of a chip carrier and circuit board substrate corresponding to the heat-generating device; and obtaining corresponding calibration parameter information based on the second temperature information.

In this embodiment of this application, the obtaining corresponding calibration parameter information based on the second temperature information includes: obtaining the corresponding calibration parameter information based on the second temperature information and a temperature drift correspondence; where the temperature drift correspondence includes a correspondence between temperature information and calibration parameter information.

In the embodiments of this application, first temperature information collected by each heat-sensitive element disposed at a peripheral position of a heat-generating device is obtained; calibration parameter information is obtained based on the first temperature information; and the calibration parameter information is sent to a signal processing chip corresponding to the heat-generating device; where the calibration parameter information is used for signal calibration by the signal processing chip. With functional characteristics of the heat-sensitive element varying with temperature, the characteristic changes of the heat-sensitive element are monitored in real time to achieve real-time monitoring of temperature of the target device and substrate (for example, a PCB) network. Then, the corresponding calibration parameter information is obtained and sent to the corresponding signal processing chip for signal calibration. Ultimately, a waveform during target signal transmission is dynamically adjusted, which ensures signal integrity of the target network and solves a series of problems caused by temperature drift, thereby effectively solving the problem in the prior art that signal performance is affected by temperature drift in circuit board structures.

The information processing apparatus in this embodiment of this application may be an apparatus, or may be a component, an integrated circuit, or a chip in a terminal. The apparatus may be a mobile electronic device or a non-mobile electronic device. For example, the mobile electronic device may be a mobile phone, a tablet computer, a notebook computer, a palmtop computer, a vehicle-mounted electronic device, a wearable device, an ultra-mobile personal computer (UMPC), a netbook, a personal digital assistant (PDA), or the like, and the non-mobile electronic device may be a server, a network attached storage (NAS), a personal computer (PC), a television (TV), a teller machine, a self-service machine, or the like. This is not specifically limited in the embodiments of this application.

The information processing apparatus in this embodiment of this application may be an apparatus with an operating system. The operating system may be an Android operating system, an iOS operating system, or another possible operating system. This is not specifically limited in the embodiments of this application.

The information processing apparatus provided in this embodiment of this application can implement the processes implemented in the method embodiment in FIG. 5. To avoid repetition, details are not described herein again.

Figure 7:
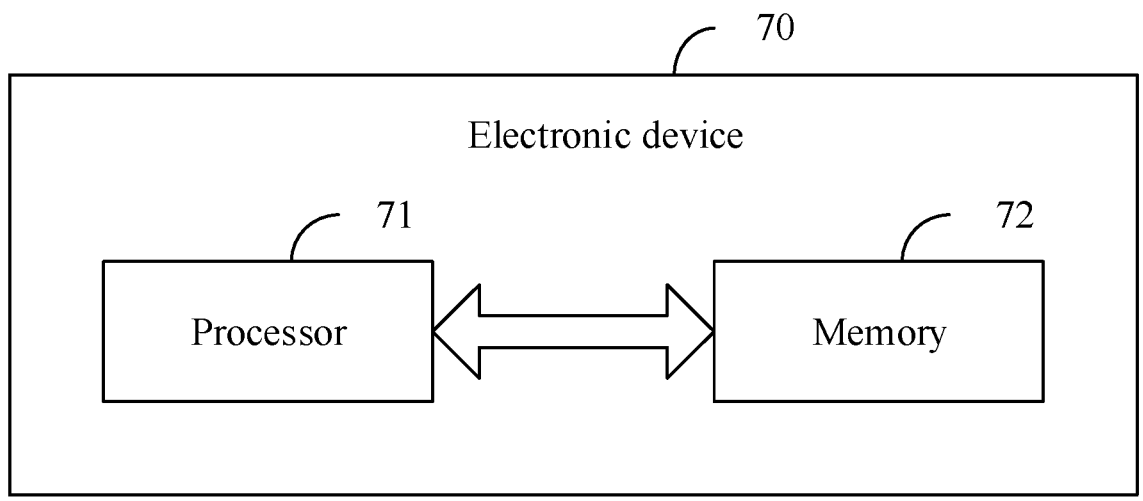
FIG. 7 is a first schematic structural diagram of a communication device according to an embodiment of this application.

The communication device in the embodiments of this application may be an electronic device. Specifically, as shown in FIG. 7, an embodiment of this application further provides an electronic device 70, including a processor 71, a memory 72, and a program or instructions stored in the memory 72 and capable of running on the processor 71. When the program or instructions are executed by the processor 71, the processes of the foregoing embodiments of the information processing method are implemented, with the same technical effects achieved. To avoid repetition, details are not described herein again.

It should be noted that the electronic device in this embodiment of this application includes the foregoing mobile electronic devices and non-mobile electronic devices.

Figure 8:
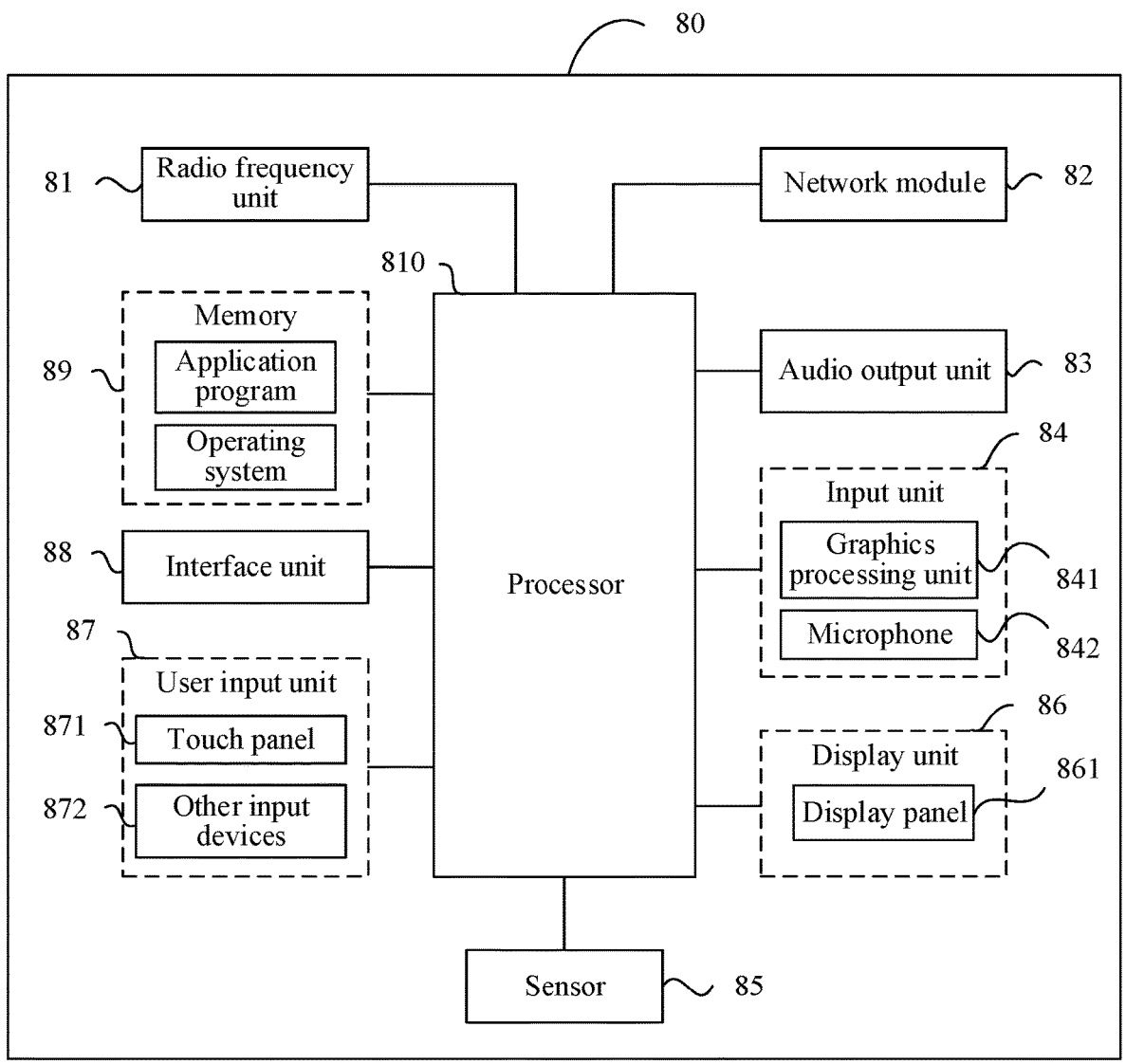
FIG. 8 is a second schematic structural diagram of a communication device according to an embodiment of this application.

The communication device in the embodiments of this application may be an electronic device. Specifically, FIG. 8 is a schematic diagram of a hardware structure of an electronic device according to an embodiment of this application.

The electronic device 80 includes but is not limited to components such as a radio frequency unit 81, a network module 82, an audio output unit 83, an input unit 84, a sensor 85, a display unit 86, a user input unit 87, an interface unit 88, a memory 89, and a processor 810.

Persons skilled in the art can understand that the electronic device 80 may further include a power supply (for example, a battery) for supplying power to the components. The power supply may be logically connected to the processor 810 via a power management system, so that functions such as charge management, discharge management, and power consumption management are implemented via the power management system. The structure of the electronic device shown in FIG. 8 does not constitute any limitation on the electronic device. The electronic device may include more or fewer components than shown in the figure, or combine some of the components, or arrange the components differently. Details are not described herein.

The processor 810 is configured to obtain first temperature information collected by each heat-sensitive element disposed at a peripheral position of a heat-generating device; obtain calibration parameter information based on the first temperature information; and send the calibration parameter information to a signal processing chip corresponding to the heat-generating device; where the calibration parameter information is used for signal calibration by the signal processing chip.

In the embodiments of this application, first temperature information collected by each heat-sensitive element disposed at a peripheral position of a heat-generating device is obtained; calibration parameter information is obtained based on the first temperature information; and the calibration parameter information is sent to a signal processing chip corresponding to the heat-generating device; where the calibration parameter information is used for signal calibration by the signal processing chip. With functional characteristics of the heat-sensitive element varying with temperature, the characteristic changes of the heat-sensitive element are monitored in real time to achieve real-time monitoring of temperature of the target device and substrate (for example, a PCB) network. Then, the corresponding calibration parameter information is obtained and sent to the corresponding signal processing chip for signal calibration. Ultimately, a waveform during target signal transmission is dynamically adjusted, which ensures signal integrity of the target network and solves a series of problems caused by temperature drift, thereby effectively solving the problem in the prior art that signal performance is affected by temperature drift in circuit board structures.

Optionally, the obtaining calibration parameter information based on the first temperature information includes: determining, based on the first temperature information, second temperature information of a chip carrier and circuit board substrate corresponding to the heat-generating device; and obtaining corresponding calibration parameter information based on the second temperature information.

Optionally, the obtaining corresponding calibration parameter information based on the second temperature information includes: obtaining the corresponding calibration parameter information based on the second temperature information and a temperature drift correspondence; where the temperature drift correspondence includes a correspondence between temperature information and calibration parameter information.

This solution can achieve the following effects:

1. The problem of deterioration of signal integrity caused by temperature drift in the PCB and IC carrier is solved, and the optimal performance experience of the terminal device at various use temperatures can be maintained, enhancing the perceived value of users.

2. Through real-time monitoring of ambient temperature and signal adjustment, the applicable ambient temperature range of the terminal device is expanded, increasing the product competitiveness.

3. Through real-time parameter adjustment, the signal integrity issues under high-frequency transmission are solved, improving applicability of the product in millimeter-wave and higher frequency bands.

It should be understood that in this embodiment of this application, the input unit 84 may include a graphics processing unit (GPU) 841 and a microphone 842. The graphics processing unit 841 processes image data of a static picture or a video that is obtained by an image capture apparatus (for example, a camera) in an image capture mode or a video capture mode. The display unit 86 may include a display panel 861. The display panel 861 may be configured in a form of a liquid crystal display, an organic light-emitting diode display, or the like. The user input unit 87 includes a touch panel 871 and other input devices 872. The touch panel 871 is also referred to as a touchscreen. The touch panel 871 may include two parts: a touch detection apparatus and a touch controller. The other input devices 872 may include but are not limited to a physical keyboard, a function button (for example, a volume control button or a power on/off button), a trackball, a mouse, and a joystick. Details are not described herein. The memory 89 may be configured to store a software program and various data which include but are not limited to an application program and an operating system. The processor 810 may integrate an application processor and a modem processor. The application processor mainly processes an operating system, a user interface, an application program, and the like. The modem processor mainly processes wireless communication. It can be understood that the modem processor may alternatively be not integrated in the processor 810.

An embodiment of this application further provides a readable storage medium, where the storage medium may be volatile or non-volatile. The readable storage medium stores a program or instructions, and when the program or instructions are executed by a processor, the processes of the foregoing embodiments of the information processing method are implemented, with the same technical effects achieved. To avoid repetition, details are not described herein again.

The processor is a processor in the electronic device in the foregoing embodiments. The readable storage medium includes a computer-readable storage medium, for example, a computer read-only memory (ROM), a random access memory (RAM), a magnetic disk, or an optical disc.

An embodiment of this application further provides a chip. The chip includes a processor and a communication interface, where the communication interface is coupled to the processor, and the processor is configured to run a program or instructions to implement the processes of the foregoing embodiments of the information processing method, with the same technical effects achieved. To avoid repetition, details are not described herein again.

It should be understood that the chip mentioned in this embodiment of this application may also be referred to as a system-level chip, a system chip, a chip system, a system-on-chip, or the like.

It should be noted that in the specification, the terms "include", "comprise", or any of their variants are intended to cover a non-exclusive inclusion, such that a process, method, article, or apparatus that includes a series of elements includes not only those elements but also other elements that are not expressly listed, or further includes elements inherent to such process, method, article, or apparatus. Without more restrictions, an element preceded by the statement "includes a . . . " does not preclude the presence of other identical elements in the process, method, article, or apparatus that includes the element. In addition, it should be noted that the scope of the method and apparatus in the implementations of this application is not limited to functions being performed in the order shown or discussed, but may further include functions being performed at substantially the same time or in a reverse order, depending on the functions involved. For example, the described method may be performed in an order different from the order described, and steps may be added, omitted, or combined. In addition, features described with reference to some examples may be combined in other examples.

From the foregoing description of the implementations, persons skilled in the art can clearly understand that the method in the foregoing embodiments may be implemented by software in combination with a necessary general hardware platform. Certainly, the method in the foregoing embodiments may alternatively be implemented by hardware. However, in many cases, the former is a preferred implementation. Based on such understanding, the technical solutions of this application essentially or the part thereof that contributes to the prior art may be implemented in a form of a computer software product. The computer software product is stored in a storage medium (for example, ROM/RAM, a magnetic disk, or an optical disc), and includes several instructions for instructing a terminal (which may be a mobile phone, a computer, a server, a network device, or the like) to perform the method described in the embodiments of this application.

The foregoing describes the embodiments of this application with reference to the accompanying drawings. However, this application is not limited to the foregoing specific implementations. These specific implementations are merely illustrative rather than restrictive. Inspired by this application, persons of ordinary skill in the art may develop many other forms without departing from the essence of this application and the protection scope of the claims, and all such forms shall fall within the protection scope of this application.

What is claimed is:

1. A circuit board structure, comprising:
a circuit board substrate, a temperature drift processing chip, and at least two heat-sensitive elements; the circuit board substrate comprising a first substrate and a second substrate opposite the first substrate; wherein
the first substrate is provided with a heat-generating device; and the second substrate has a cavity, the cavity being provided with at least one boss extending toward the first substrate; and
the heat-generating device is located between the first substrate and the boss; the at least two heat-sensitive elements are disposed at a peripheral position of the heat-generating device; and the temperature drift processing chip is electrically connected to the at least two heat-sensitive elements, and the temperature drift processing chip is disposed on the circuit board substrate.

2. The circuit board structure according to claim 1, wherein a recess is formed between the boss and a side wall of the cavity or between two of the bosses; wherein
the temperature drift processing chip is disposed in the recess or on the boss.

3. The circuit board structure according to claim 1, wherein the peripheral position comprises a position surrounding the heat-generating device on the first substrate and a position opposite the heat-generating device on a boss opposite the heat-generating device.

4. The circuit board structure according to claim 1, wherein the second substrate is connected to the first substrate through a side wall of the cavity, and/or
the second substrate is connected to the first substrate through at least one of the bosses.

5. A communication device, comprising a circuit board structure, wherein the circuit board structure comprises:
a circuit board substrate, a temperature drift processing chip, and at least two heat-sensitive elements; the circuit board substrate comprising a first substrate and a second substrate opposite the first substrate; wherein
the first substrate is provided with a heat-generating device; and the second substrate has a cavity, the cavity being provided with at least one boss extending toward the first substrate; and
the heat-generating device is located between the first substrate and the boss; the at least two heat-sensitive elements are disposed at a peripheral position of the heat-generating device; and the temperature drift processing chip is electrically connected to the at least two heat-sensitive elements, and the temperature drift processing chip is disposed on the circuit board substrate.

6. The communication device according to claim 5, wherein the communication device further comprises a signal processing chip electrically connected to a temperature drift processing chip on the circuit board structure.

7. The communication device according to claim 5, wherein a recess is formed between the boss and a side wall of the cavity or between two of the bosses; wherein the temperature drift processing chip is disposed in the recess or on the boss.

8. The communication device according to claim 5, wherein the peripheral position comprises a position surrounding the heat-generating device on the first substrate and a position opposite the heat-generating device on a boss opposite the heat-generating device.

9. The communication device according to claim 5, wherein the second substrate is connected to the first substrate through a side wall of the cavity, and/or
the second substrate is connected to the first substrate through at least one of the bosses.

10. An information processing method, applied to a communication device comprising a circuit board structure, wherein the circuit board structure comprises:
a circuit board substrate, a temperature drift processing chip, and at least two heat-sensitive elements; the circuit board substrate comprising a first substrate and a second substrate opposite the first substrate; wherein
the first substrate is provided with a heat-generating device; and the second substrate has a cavity, the cavity being provided with at least one boss extending toward the first substrate; and
the heat-generating device is located between the first substrate and the boss; the at least two heat-sensitive elements are disposed at a peripheral position of the heat-generating device; and the temperature drift processing chip is electrically connected to the at least two heat-sensitive elements, and the temperature drift processing chip is disposed on the circuit board substrate;
wherein the information processing method comprises:
obtaining first temperature information collected by each heat-sensitive element disposed at a peripheral position of a heat-generating device;
obtaining calibration parameter information based on the first temperature information; and
sending the calibration parameter information to a signal processing chip corresponding to the heat-generating device; wherein
the calibration parameter information is used for signal calibration by the signal processing chip.

11. The information processing method according to claim 10, wherein the obtaining calibration parameter information based on the first temperature information comprises:
determining, based on the first temperature information, second temperature information of a chip carrier and circuit board substrate corresponding to the heat-generating device; and
obtaining corresponding calibration parameter information based on the second temperature information.

12. The information processing method according to claim 11, wherein the obtaining corresponding calibration parameter information based on the second temperature information comprises:
obtaining the corresponding calibration parameter information based on the second temperature information and a temperature drift correspondence; wherein
the temperature drift correspondence comprises a correspondence between temperature information and calibration parameter information.

13. The information processing method according to claim 10, wherein the communication device further comprises a signal processing chip electrically connected to a temperature drift processing chip on the circuit board structure.

14. The information processing method according to claim 10, wherein a recess is formed between the boss and a side wall of the cavity or between two of the bosses; wherein
the temperature drift processing chip is disposed in the recess or on the boss.

15. The information processing method according to claim 10, wherein the peripheral position comprises a position surrounding the heat-generating device on the first substrate and a position opposite the heat-generating device on a boss opposite the heat-generating device.

16. The information processing method according to claim 10, wherein the second substrate is connected to the first substrate through a side wall of the cavity, and/or
the second substrate is connected to the first substrate through at least one of the bosses.

17. A communication device, comprising a processor, a memory, and a program or instructions stored in the memory and capable of running on the processor, wherein when the program or instructions are executed by the processor, the steps of the information processing method according to claim 10 are implemented.

18. A non-transitory readable storage medium, wherein the non-transitory readable storage medium stores a program or instructions, and when the program or instructions are executed by a processor, the steps of the information processing method according to claim 10 are implemented.

19. A chip, wherein the chip comprises a processor and a communication interface, the communication interface is coupled to the processor, and the processor is configured to run a program or instructions to implement the steps of the information processing method according to claim 10.

20. A computer program product, wherein the computer program product is stored in a non-volatile storage medium, and the computer program product is executed by at least one processor to implement the steps of the information processing method according to claim 10.

* * * * *